United States Patent
Lesea et al.

(10) Patent No.: US 6,496,971 B1
(45) Date of Patent: Dec. 17, 2002

(54) SUPPORTING MULTIPLE FPGA CONFIGURATION MODES USING DEDICATED ON-CHIP PROCESSOR

(75) Inventors: Austin H. Lesea, Los Gatos, CA (US); Stephen M. Trimberger, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/499,499

(22) Filed: Feb. 7, 2000

(51) Int. Cl.⁷ .......................... G06F 17/50; G06F 1/24; G06F 9/24; G06F 9/312; H03K 19/177

(52) U.S. Cl. ........................ 716/16; 716/18; 713/2; 713/100; 710/14; 711/1; 326/38; 326/40; 326/41; 326/47

(58) Field of Search .................... 716/1–21; 713/1–100; 710/8–14; 711/1–6; 326/37–50

(56) References Cited

U.S. PATENT DOCUMENTS

| 5,109,503 A |   | 4/1992  | Cruickshank et al. |
|-------------|---|---------|--------------------|
| 5,263,168 A | * | 11/1993 | Toms et al. ................. 713/1 |
| 5,321,840 A | * | 6/1994  | Ahlin et al. ............... 717/178 |
| 5,438,672 A |   | 8/1995  | Dey |
| 5,479,618 A | * | 12/1995 | Van de Steeg et al. ....... 700/23 |
| 5,794,033 A | * | 8/1998  | Aldebert et al. ............ 713/100 |
| 5,892,961 A |   | 4/1999  | Trimberger ................. 712/10 |
| 5,956,518 A | * | 9/1999  | DeHon et al. ............... 712/15 |

(List continued on next page.)

FOREIGN PATENT DOCUMENTS

| EP | 0 759 662 A2 | 2/1997 |            |
|----|--------------|--------|------------|
| JP | 07154241 A * | 6/1995 | ......... H03K/19/173 |

OTHER PUBLICATIONS

Madrenas et al. ("Rapid prototyping of electronic systems using FIPSOC", 1999 IEEE 7th International Conference on Emerging Technologies and Factory Automation, vol. 1, Oct. 18, 1999, pp. 287–296).*

Faura et al. ("A novel mixed signal programmable device with on–chip microprocessor", Proceedings of IEEE 1997 Custom Integrated Circuits Conference, May 5, 1997, pp. 103–106).*

(List continued on next page.)

Primary Examiner—Matthew Smith
Assistant Examiner—Phallaka Kik
(74) Attorney, Agent, or Firm—T. Lester Wallace; Edel M. Young (57) ABSTRACT

An FPGA has an on-chip processor that reads configuration data onto the FPGA and controls the loading of that configuration data into FPGA configuration memory cells. After FPGA power-up, the processor reads a configuration mode code from predetermined terminals of the FPGA. If the configuration mode code has a first value, then the processor executes a first configuration program so that configuration data is received onto the FPGA in accordance with a first configuration mode. If the configuration mode code has a second value, then the processor executes a second configuration program so that configuration data is received onto the FPGA in accordance with a second configuration mode. The configuration programs can be stored in metal-mask ROM on-chip so they can be changed without re-laying out the remainder of the FPGA. Providing multiple configuration programs allows the FPGA to support multiple configuration modes using the same processor hardware. One configuration mode code causes the processor to execute a loader program that in turn loads a configuration program onto the FPGA from a source external to the FPGA. Once the configuration program is loaded, the processor executes the configuration program thereby allowing the FPGA to support a custom configuration mode.

32 Claims, 5 Drawing Sheets

U.S. PATENT DOCUMENTS

| | | | | |
|---|---|---|---|---|
| 6,026,481 A | * | 2/2000 | New et al. | 712/43 |
| 6,078,736 A | * | 6/2000 | Guccione | 716/16 |
| 6,134,707 A | * | 10/2000 | Herrmann et al. | 717/139 |
| 6,141,756 A | * | 10/2000 | Bright et al. | 713/200 |
| 6,178,494 B1 | * | 1/2001 | Casselman | 712/37 |
| 6,255,849 B1 | * | 7/2001 | Mohan | 326/41 |

OTHER PUBLICATIONS

Ling et al. ("WASMII: a data driven computer on a virtual hardware", IEEE 1993 Proceedings of IEEE Workshop on FPGAs for Custom Computing Machines, Apr. 5–7, 1993, Napa, CA, pp. 33–42).*

Tsutsui et al. ("ANT–on–YARDS: FPGA/MPU hybrid architecture for telecommunication data processing", IEEE Transactions on Very Large Scale Integration (VLSI) Systems, vol. 6, No. 2, Jun. 1998,, pp. 199–211).*

Fawcett et al. ("Reconfigurable processing with field programmable gate arrays", Proceedings of International Conference on Application Specific Systems, Architectures and Processors, Aug. 19, 1996, pp. 293–302).*

"The Programmable Logic Data Book", (1999) available from Xilinx, Inc., 2100 Logic Drive, San Jose, California 95124.

* cited by examiner

SUPPORTING MULTIPLE FPGA CONFIGURATION MODES USING DEDICATED ON-CHIP PROCESSOR

TECHNICAL FIELD

This invention relates to configuring a memory-based programmable logic device. More particularly, this invention relates to configuring a memory-based field programmable gate array (FPGA).

BACKGROUND INFORMATION

A field programmable gate array (FPGA) is a general purpose programmable device that is customizable by an end user to realize a desired user-specific circuit. The basic device architecture involves an array of configurable logic blocks (CLBs) embedded in a configurable interconnect structure and surrounded by configurable I/O blocks (IOBs). Each IOB is configurable to be an output buffer, an input buffer, or a bidirectional buffer. An IOB is configurable to register incoming data, to register outgoing data, and/or to provide a tri-state output. A CLB is configurable to perform one of many logic functions. For example, a CLB may be configured to realize combinatorial logic elements, sequential logic elements, lookup tables, and/or control multiplexers. To realize a desired user-specific circuit, the end user configures the configurable interconnect structure to connect the circuitry of multiple configured CLBs and multiple configured IOBs together so that the resulting circuit is the desired user-specific circuit.

In one type of FPGA called a memory-based FPGA, the IOBs, the CLBs and the programmable interconnect structure of the FPGA are configured by loading configuration data into associated configuration memory cells. Each IOB and CLB has associated configuration memory cells, the contents of which determine how the IOB or CLB is configured. Similarly, the programmable interconnect structure includes configuration memory cells. The programmable interconnect structure includes programmable points which control connection of wiring segments in the programmable interconnect structure. Each programmable interconnect point may be a pass transistor controlled by an associated configuration memory cell. Wire segments on each side of the pass transistor are either connected or not connected depending on whether the transistor is turned on by the associated configuration memory cell. Further information about FPGAs appears in "The Programmable Logic Data Book 1999", copyright 1999 by Xilinx, Inc. and available from Xilinx, Inc., at 2100 Logic Drive, San Jose, Calif. 95124 (the subject matter of this data book is incorporated herein by reference).

Configuration is the process of loading configuration data into the configuration memory cells which control the programmable interconnect structure, the IOBs, and the CLBs. An FPGA available from Xilinx, Inc. generally supports more than one configuration mode. In a first configuration mode called the "Master Serial Mode", configuration data is typically stored in an external memory such as an external ROM. The FPGA uses an on-chip oscillator to emit a clock signal that causes successive bits of the configuration data to be read out onto a data terminal of the external memory. The data terminal of the external memory is coupled to an input terminal of the FPGA (an IOB that is configured to be an input terminal) such that the successive bits of configuration data are read into the FPGA in serial fashion, one bit at a time. The configuration memory cell that each respective configuration data bit is written to is determined by the location of the configuration data bit in the serial stream of configuration data bits. In one mode, the configuration data is broken up into packets of data called frames. As each frame is received, it is shifted into a frame register until the frame register is filled. The configuration data in the frame register is then loaded in parallel into one row of configuration memory cells. The configuration memory cells in this case are organized for loading purposes as a two-dimensional array. Following the loading of the first frame, a subsequent frame of configuration data is shifted into the FPGA, and another row of configuration memory cells is loaded. In this way, configuration data is loaded into the FPGA in serial fashion, one bit at a time, but the two-dimensional array of configuration memory cells is loaded in parallel, one frame at a time.

The loading of the configuration data into the FPGA in serial fashion can be undesirably time consuming. A Xilinx FPGA therefore typically supports a second configuration mode called the "Master Parallel Model". In this second mode, configuration data is loaded into the FPGA from an external memory (for example, a ROM) in parallel fashion, eight bits at a time. The FPGA outputs a twenty-two bit address onto twenty-two address terminals of the FPGA (twenty-two IOBs used as output terminals). These twenty-two address terminals of the FPGA are coupled to a corresponding twenty-two address terminals of the external ROM. The FPGA increments the address to cause successive eight-bit configuration data values to be read out of the external ROM and into the FPGA on eight data input terminals (eight IOBs used as input terminals). Multiple such eight-bit values of configuration data bits are assembled to form a frame of configuration data. The configuration data bits of this frame are then written in parallel into a row of the two-dimensional array of configuration memory cells. A second frame of configuration bits is then read into the FPGA and is written in parallel form into a second row of the two-dimensional array of configuration memory cells. In this way, configuration data bits are loaded into the FPGA as a series of eight-bit values, and the two-dimensional array of configuration memory cells is loaded one frame at a time.

For backward compatibility purposes, it is generally desired that each successive FPGA family support the configuration modes (called "legacy configuration modes") supported by prior families. A new configuration mode may also be added to new FPGA families from time to time. Accordingly, more and more hardware has generally been required to support an ever increasing number of "legacy configuration modes". A solution is desired that reduces the amount of hardware required to support multiple configuration modes.

SUMMARY

Rather than using dedicated hardwired logic to support multiple configuration modes, a processor is provided on the FPGA for this purpose. After power-up, the processor reads a configuration mode code present on predetermined terminals of the FPGA. The configuration mode code read from these terminals determines the configuration mode that will be used to load configuration data into the FPGA.

If the configuration mode code has a first value, then the processor executes a first program. Execution of the first program causes the processor to control IOBs and other hardware on the FPGA so as to load configuration data onto the FPGA and into the configuration memory cells in accordance with a first configuration mode. If, on the other hand, the configuration mode code has a second value, then the processor executes a second program. Execution of the second program causes the processor to control IOBs and other hardware on the FPGA so as to load configuration data onto the FPGA and into the configuration memory cells in accordance with a second configuration mode. The first and second programs executed by the processor may be stored in on-chip metal-mask read-only-memory (ROM) such that a program can be changed without having to re-layout the remainder of the FPGA and without having to incur significant cost. Providing multiple configuration programs executable on the same processor allows the FPGA to support multiple configuration modes using the same processor hardware.

In one embodiment, a new user-provided configuration mode is supported. If the configuration mode code read after power-up has a particular value, then the processor executes a loader program. Execution of the loader program causes the processor to control IOBs on the FPGA such that a user-provided configuration program is read onto the FPGA and is loaded into program memory used by the processor. Such a user-provided configuration program may, for example, be read into the FPGA one eight-bit byte at a time. After the user-provided configuration program has been read into the FPGA, the loader program terminates and the processor executes the newly loaded configuration program. Execution of the newly loaded configuration program causes configuration data to be loaded onto the FPGA and to be loaded into the configuration memory cells in accordance with a user-defined configuration mode. In this way, the FPGA is programmed to support a user-defined configuration mode.

Other structures and methods are described in the detailed description below. This summary does not purport to define the invention. The invention is defined by the claims.

DETAILED DESCRIPTION

Figure 1:
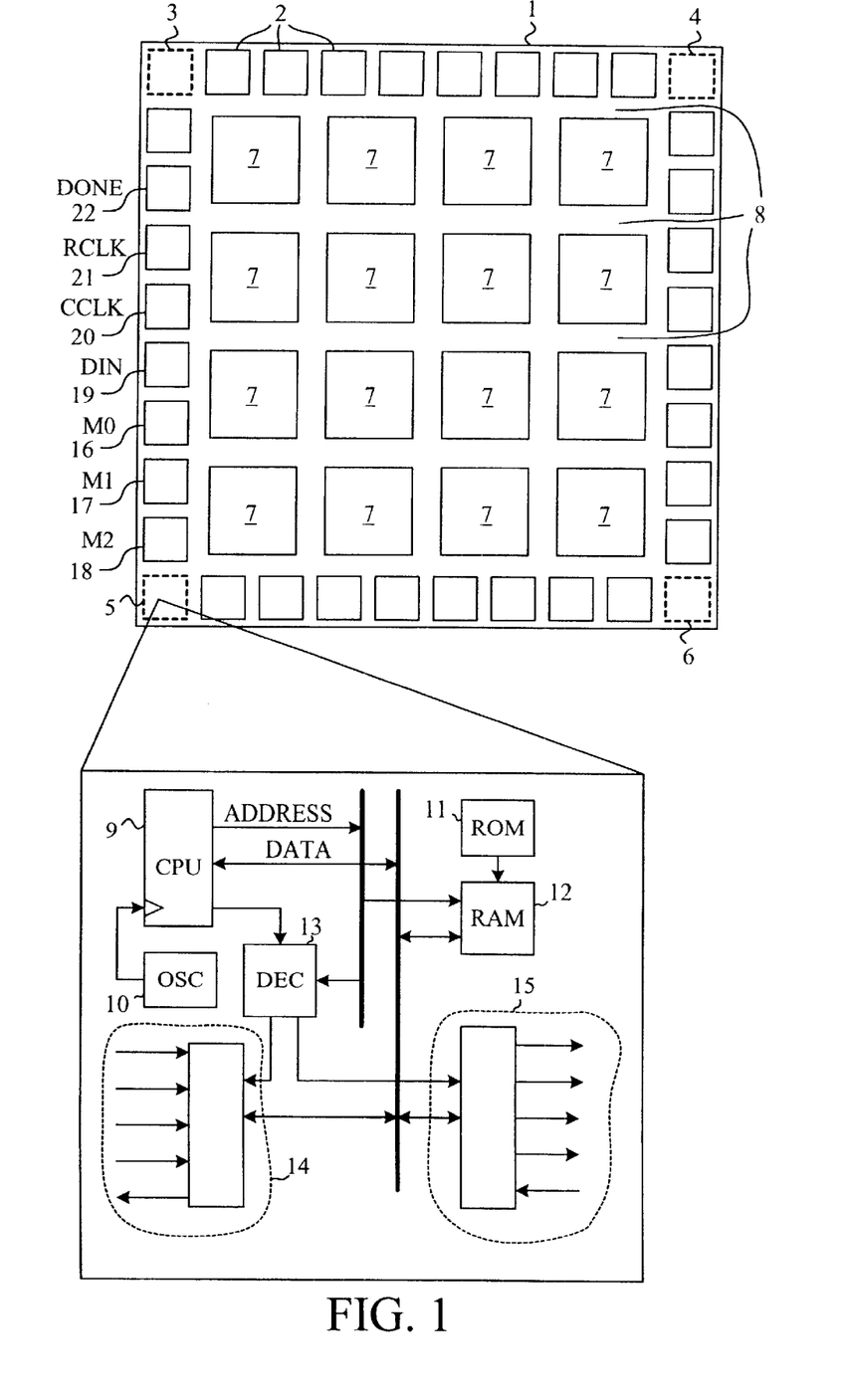
FIG. 1 is a simplified top-down diagram of a field programmable gate array (FPGA) in accordance with an embodiment of the present invention.

FIG. 1 is a simplified top-down diagram of a field programmable gate array (FPGA) integrated circuit 1 in accordance with an embodiment of the present invention. FPGA 1 includes a ring of I/O blocks (IOBs) 2, four corner blocks (CBS) 3–6, an inner two-dimensional array of configurable logic blocks (CLBS) 7, and a programmable interconnect structure 8. The IOBs, CLBs and the programmable interconnect structure contain configuration memory cells, the contents of which determine how the IOBs, CLBs and programmable interconnect structure are configured. These configuration memory cells are organized, for conceptual and loading purposes, in a two-dimensional array.

Each IOB includes a terminal in the sense that the IOB provides a location at which a connection is made to the FPGA integrated circuit 1. The location is usually a bonding pad of the IOB and the connection to the bonding pad is usually a bonding wire that forms an electrical connection from the bonding pad to an integrated circuit package containing FPGA integrated circuit 1. For additional information on the structure of FPGA 1 in general, including the structure and operation of IOBs 2, CLBs 7 and programmable interconnect structure 8, see: "XC4000E and XC4000X Series Field Programmable Gate Arrays", pages 6–5 to 6–68, "The Programmable Logic Data Book 1999", copyright 1999 by Xilinx, Inc. and available from Xilinx, Inc. at 2100 Logic Drive, San Jose, Calif. 95124 (the subject matter of these data book pages is incorporated herein by reference).

AS illustrated in the expanded portion at the bottom of FIG. 1, corner block 5 includes a processor 9, an on-chip oscillator 10, an amount of non-volatile memory 11 (for example, ROM or FLASH memory), an amount of random-access-memory (RAM) 12, decoding circuitry 13, interface logic 14 to interface with selected IOB terminals during configuration, and interface logic 15 to write to and read from the configuration memory cells of the remaining IOBs 2, CLBs 7 and the programmable interconnect structure 8.

Figure 2:
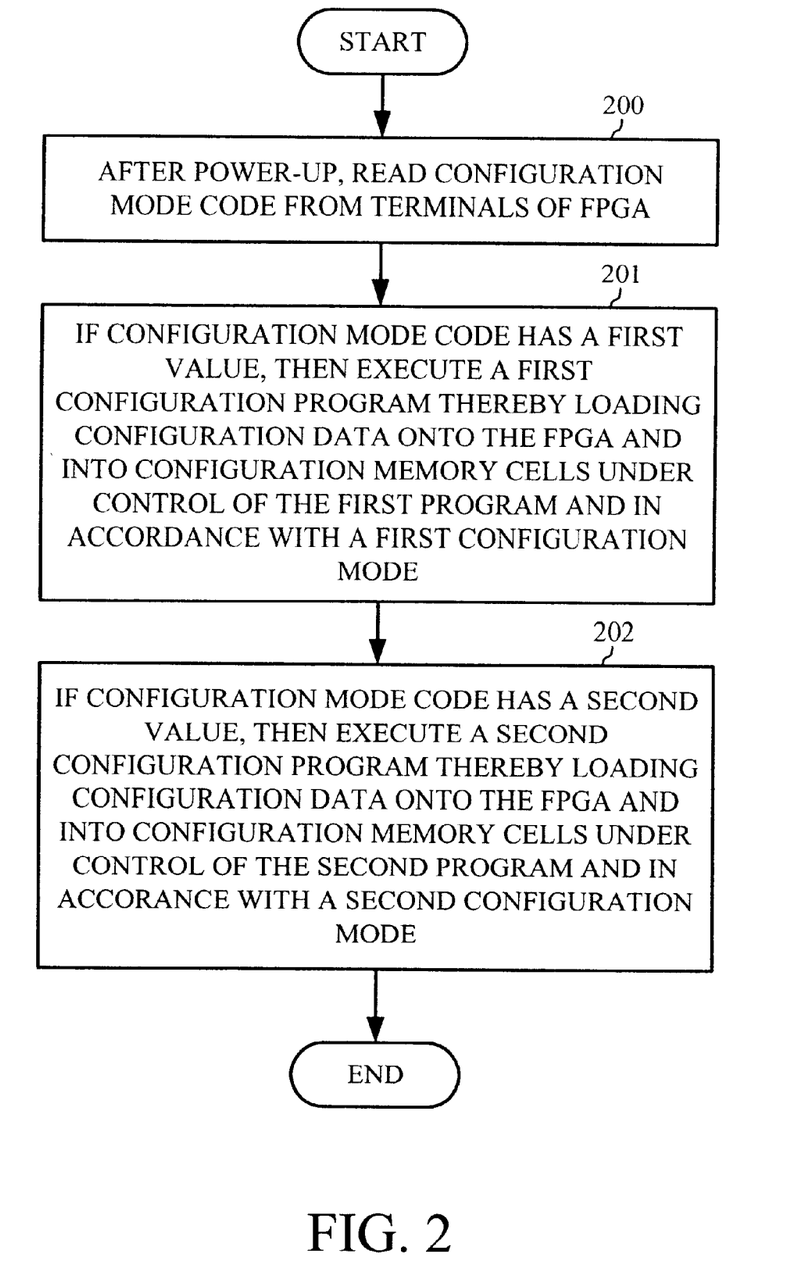
FIG. 2 is a flowchart of a method in accordance with an embodiment of the present invention.

FIG. 2 is a flowchart of a method in accordance with an embodiment of the present invention. After power-up,, programs stored in non-volatile memory 11 are loaded into RAM 12. The processor 9 is clocked by a clock signal from on-chip oscillator 10 such that processor 9 fetches a first instruction from a predetermined location in RAM 12 and begins execution of a program stored there. Execution of this program causes processor 9 to use logic 14 to read a three-bit "configuration mode code" (step 200) on the terminals of IOBs 16–18. These terminals are designated M0, M1 and M2, respectively. The configuration mode code is placed on terminals M0, M1 and M2 by the user by means external to the FPGA 1.

If the configuration mode code is a first value, then processor 9 begins executing a first configuration mode program (step 201) in RAM 12. This configuration mode program controls multiple of the IOBs so that they will be configured appropriately for supporting a first configuration mode. These particular IOBs are configured in this way by processor 9 using interface logic 14 as described below.

In one example, the first configuration mode code for <M2:M1:M0> is <0:0:0> and the first configuration mode is the "master serial mode" set forth on page 6–61 of the Xilinx "The Programmable Logic Data Book 1999". IOB 19 is therefore used as an input terminal DIN for the incoming serial data and IOB 20 is used as an output terminal for outputting a clock signal CCLK from FPGA 1. The clock signal CCLK is generated from on-chip oscillator 10 and is supplied via terminal CCLK of IOB 20 to a clock input terminal of a serial external PROM (not shown). Each successive clock pulse of the CCLK signal output by FPGA 1 causes another configuration data bit to be read out of a data output terminal of the external PROM. This data output terminal is coupled to DIN terminal of IOB 19 by a connection external to the FPGA such that successive configuration data bits are received onto terminal DIN in serial fashion. Processor 9 reads this incoming serial bit stream of configuration data from terminal DIN and uses interface logic 15 to write the configuration data to the configuration memory cells.

Alternatively, the configuration data bits are provided in parallel to 8 pins and loaded in parallel to 8 successive bits of a frame. As another alternative, the configuration data bits are provided in series on one pin but converted internally to an 8-bit parallel sequence for loading into a frame register.

In any case, the first program causes processor 9 to assemble the various configuration data bits in the incoming bit stream into a frame of configuration bits. The first program then causes the bits of the frame to be written in parallel into a first row of the configuration memory cells of FPGA 1. Processor 9 then reads the next configuration data bits from terminal DIN, assembles those configuration data bits into another frame, and then writes this next frame into a second row of the configuration memory cells of the FPGA 1. In this way, configuration data bits are loaded into FPGA 1 in serial fashion from input terminal DIN under software control and are written into the configuration memory cells of the FPGA in parallel one frame at a time in accordance with the first configuration mode.

If, on the other hand, the configuration mode code is a second value, then processor 9 begins executing a second configuration mode program (step 202) in RAM 12. This configuration mode program controls multiple of the IOBs so that they will support a second configuration mode. In one example, the second configuration mode code for <M2:M1:M0> is <1:0:0> and the second configuration mode is the "master parallel up mode" as set forth on page 6–62 of "The Programmable Logic Data Book 1999". Eight IOBS (IOB 19 and seven other IOBs) are used as data input terminals DI0–DI7 for receiving eight-bit bytes of configuration data. IOB 21 is used as an output terminal RCLK for outputting a clock signal RCLK from the FPGA. Twenty-two other IOBs (not shown) are used to output a twenty-two bit address A0–A21.

Execution of the second program causes processor 9 to output a twenty-two bit address from the twenty-two address output terminals A0–A21. This address is valid on a rising edge of the clock signal RCLK supplied from the RCLK terminal of the FPGA. The twenty-two bit address and the clock signal RCLK are supplied onto address and enable terminals of an external PROM (not shown) such that a first eight-bit byte of configuration data is output onto eight data output terminals of the external PROM. These eight data output terminals are coupled to the eight data input terminals DI0–DI7 of FPGA 1. Processor 9 uses interface logic 14 to read this byte of configuration data from data input terminals DI0–DI7. Processor 9 then increments the twenty-two bit address to address the next byte of configuration data in the external PROM, pulses the clock signal RCLK, and reads the next byte of configuration data from data input terminals DI0–DI7 of FPGA 1. In this way, processor 9 reads successive eight-bit bytes of configuration data out of the external PROM by incrementing the twenty-two bit address. Processor 9 assembles these bytes of configuration data to form a frame of configuration data and then writes the bits of the frame in parallel into a first row of the configuration memory cells of FPGA 1. Processor 9 then increments the twenty-two bit address, receives the next bytes of configuration data, assembles that configuration data into a second frame, and then writes this second frame into a second row of the configuration memory cells of the FPGA 1. In this way, configuration data bits are loaded into FPGA 1 one byte at a time under software control and are written into the configuration memory cells of the FPGA in parallel one frame at a time in accordance with the second configuration mode. In this example of the first and second configuration modes, the configuration data is written into the configuration memory cells in the same way. In this example, the configuration data bit stream does not contain processor instructions.

After the configuration memory cells have been loaded, the configuration program being executed causes what is called a "start-up" sequence to occur wherein FPGA operation transitions from the configuration process to the intended user operation. Any IOBs that were used for loading configuration data are available for use in the user-specific circuit and may be configured for that use at the end of the configuration process when all configuration data has been loaded through these IOBs. A signal on a terminal DONE of IOB 22 then transitions from low to high indicating completion of the configuration process and the start-up sequence. For additional information on an example of a start-up sequence, see pages 6–51 through 6–54 of "The Programmable Logic Data Book 1999".

Figure 3:
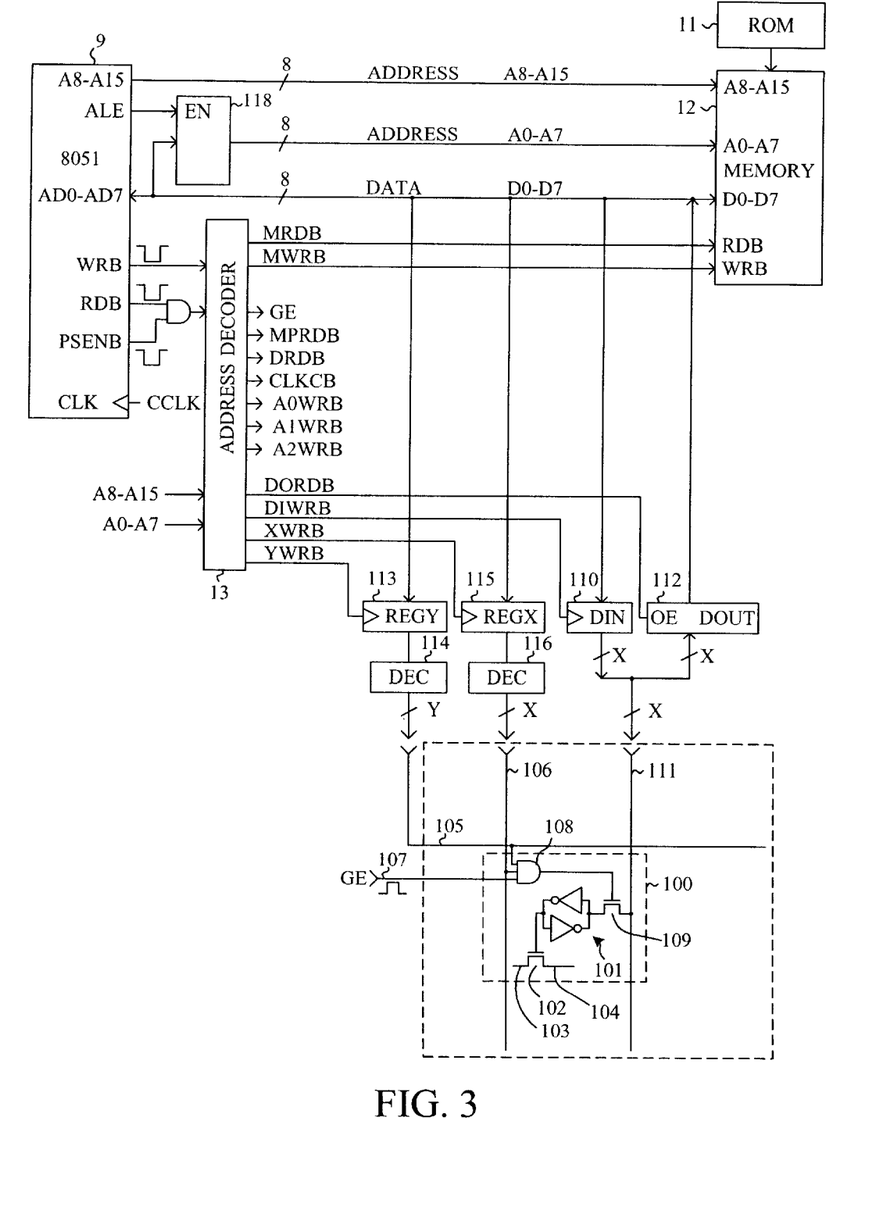
FIGS. 3, 4A, and 4B are simplified circuit diagrams of possible implementations of the processor and interface circuitry of FIG. 1.
Figure 4A:
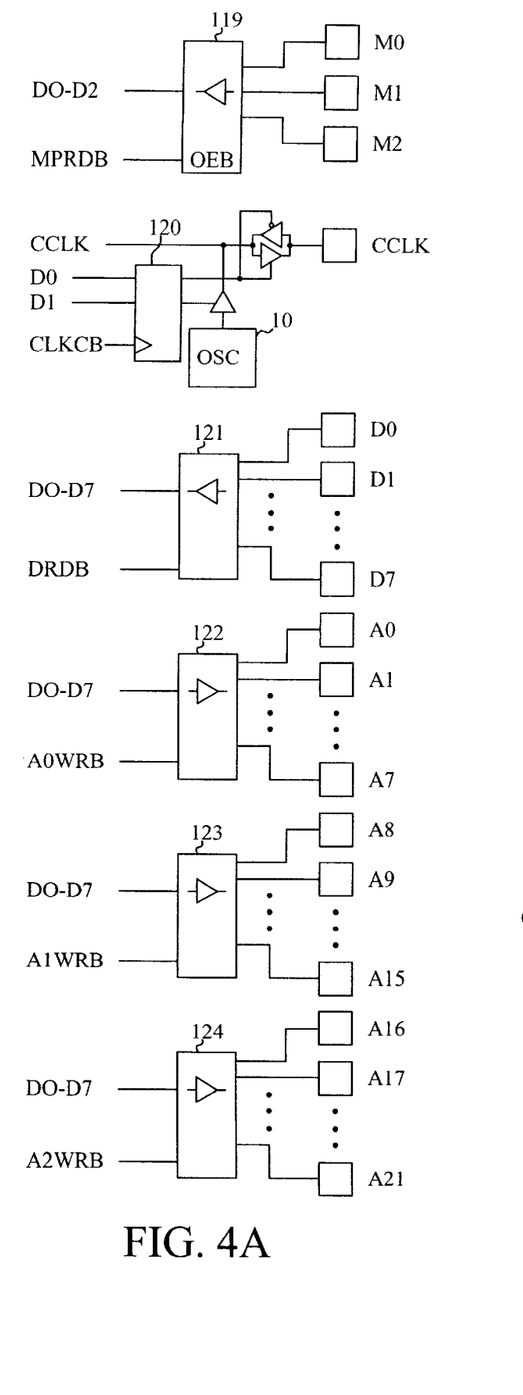
Figure 4B:
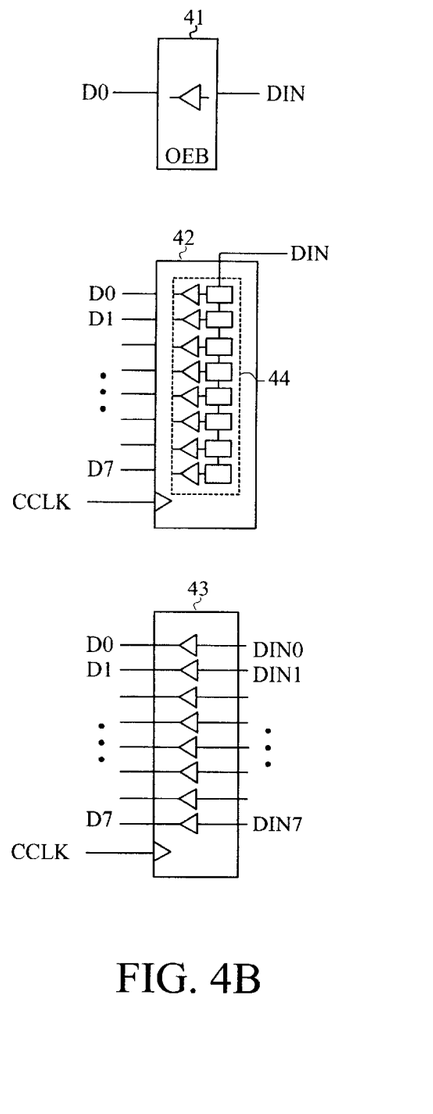

FIGS. 3 and 4 are simplified circuit diagrams that show additional detail of one possible implementation of processor 9 and its associated interface circuitry 14 and 15. Dashed rectangle 100 represents one configuration memory cell. In this case, the configuration memory cell is a configuration memory cell of the programmable interconnect structure 8. If cross-coupled latch 101 is loaded such that a digital one is present on the gate of pass transistor 102, then the configuration memory cell is configured so that wire segments 103 and 104 are connected. If latch 101 is loaded such that a digital zero is present on the gate of pass transistor 102, then the configuration memory cell is configured so that wire segments 103 and 104 are not connected.

Although only one such configuration memory cell 100 is shown in FIG. 3, there are Y rows of X configuration memory cells each that form the two-dimensional array of configuration memory cells described above. Some of the configuration memory cells are for IOBs, some are for CLBs, and some are for the programmable interconnect structure.

Each row of configuration memory cells has an associated Y address line. Line 105 in FIG. 3 is the Y address line associated with the row of configuration memory cell 100. Each column has an associated X address line. Line 106 in FIG. 3 is the X address line associated with the column of configuration memory cell 100. If a digital high is present on the X address line of a configuration memory cell, and a digital high is present on the Y address line of the configuration memory cell, and a global enable line 107 is pulsed with a high pulse, then an AND gate 108 of the configuration memory cell outputs a digital high pulse thereby enabling an access transistor 109. If a frame buffer 110 drives a digital value onto a data line 111 of the configuration memory cell, then this digital value will be loaded into the configuration memory cell and will be stored by the latch. If frame buffer 110 is not output enabled, then latch 101 drives the stored configuration data through enabled access transistor 109 and onto data line 111. This data can then be read by processor 9 via a readback buffer 112.

Memory cell 100 is illustrated in FIG. 3 as a five-transistor memory cell with a single access transistor 109. In other embodiments, an equivalent to memory cell 100 uses six transistors: one access transistor connecting from a bit line to one terminal of the latch 101, and another access transistor connecting from a bit-bar line to the complementary terminal of latch 101. Since such 6-transistor memory cells are well known, they have not been illustrated here.

Processor 9 addresses a particular row of configuration memory cells by writing a value to Y register 113. This value is decoded by decoder 114 into a multi-bit value that is driven onto the Y address lines. In one embodiment, processor 9 writes a value to the Y register such that only one row is addressed at a time.

Processor 9 can address one particular column, all columns, or any combination of columns by writing an appropriate value into X register 115. The value in X register 115 is decoded by decoder 116 to generate the multi-bit value driven onto the X address lines. If an entire frame (a row) of configuration memory cells is to be written, then a value is written into X register 115 that is decoded such that all X address lines are driven with digital ones. Accordingly, all the memory cells of a row are addressed. (The "frame buffer" may actually include multiple eight-bit DIN registers, one associated with each successive eight columns. Similarly, the "readback buffer" may actually include multiple eight-bit DOUT buffers, one associated with each successive eight columns.) Y register 113, X register 115, frame buffer 110, and readback buffer 112 are accessed by processor 9 by reading from or writing to corresponding addresses. DORDB is the data out (readback) buffer read strobe bar (active low). DIWRB is the data in (frame buffer) buffer write strobe bar (active low). XWRB is the X register write strobe bar (active low). YWRB is the Y register write strobe bar (active low). GE is the global enable strobe supplied to all configuration memory cells. Processor 9 accesses RAM 12 using a memory read strobe bar MRDB (active low) and a memory write strobe bar MWRB (active low). Address decoder 13 generates these strobe signals using address and control signals including the address on address bus lines A0–A15, the write strobe WRB output by processor 9, the read strobe RDB output by processor 9, and the program memory read strobe PSENB output by processor 9. An address latch 118 is provided to latch the low-order address from the address/data lines AD0–AD7.

FIG. 4A is a simplified diagram of interface logic 14 by which processor 9 reads from and/or writes to IOBs during the configuration process. Processor 9 reads the configuration mode code from terminals M0, M1 and M2 via an input buffer 119 and a read strobe signal MPRDB (active low). Processor 9 controls, via register 120 and a strobe signal CLKCB (active low), whether terminal CCLK outputs a clock signal or receives a clock signal, and whether internal oscillator 10 is enabled. Processor 9 outputs the twenty-two bit address onto terminals A0-A21 via output buffers 122–124 and address output write strobes A0WRB, A1WRB and A2WRB (active low signals). Processor 9 reads data input terminals D0–D7 via input buffer 121 and a data read buffer strobe DRDB (active low).

Interface logic 14 can be implemented either using dedicated hardware (small and fast but less flexible) or using programmable hardware (flexible but slower). In the dedicated hardware embodiment, circuits such as shown in FIGS. 4A and 4B are provided as dedicated hardware in the FPGA.

In the programmable embodiment, the circuits of FIGS. 4a and 4b are implemented by loading memory cells in the respective IOBs of the illustrated pads in order to configure those IOBs for managing configuration of the remainder of the FPGA. If the mode uses more complex features, such as the shift register 44 in FIG. 4B, it may be necessary to program interconnect and CLBs as well.

For a serial-in serial-out interface (either with fixed hardware or structures configured in the FPGA), as shown in FIG. 4B, circuit 41 receives a serial bitstream from data input pin DIN and provides a serial output signal on line DO. For a serial-in parallel-out interface, a second circuit 42 receives a serial bitstream, which passes through a shift register 44 and is periodically output as eight parallel output signals onto lines D0 through D7. For a byte-wide-transfer interface, a third circuit 43 receives eight parallel input signals on lines DIN0 through DIN7 and provides eight parallel output signals on lines D0 through D7.

The circuit of FIG. 4A allows for an external device to read back data stored within the FPGA. In the second embodiment shown in FIG. 4A, the IOBs of the terminals M0–M2, CCLK, D0–D7 and A0–A21 are initialized appropriately. In the second embodiment, this initialization is performed under software control by loading their respective configuration memory cell data into a temporary storage within the FPGA during the configuration operation, and when all configuration data have been loaded through these IOBS, the IOBs are configured for use during operation of the FPGA by loading the data from temporary storage into the IOB configuration memory cells.

The input and output registers and buffers 119–124 and the connections from those registers and buffers to the data bus of processor 9 and decoder 13 are realized by programming certain configuration memory cells of the programmable interconnect structure at the beginning of the configuration program. Whereas X register 115, Y register 113, decoders 114 and 116, frame buffer (frame register) 110, and readback buffer 112 of FIG. 3 are realized using dedicated hardwired logic, the register and buffers 119–124 of FIG. 4A are realized in this embodiment using configurable circuitry of appropriately configured CLBs. To avoid overwriting configuration bits needed for IOB connections, either all configuration bits used for IOB connections to processor 9 must be in the last frame configured, or configuration bits for the IOB connections must be stored in internal FPGA memory until all configuration data has been loaded through these IOBs.

Figure 5:
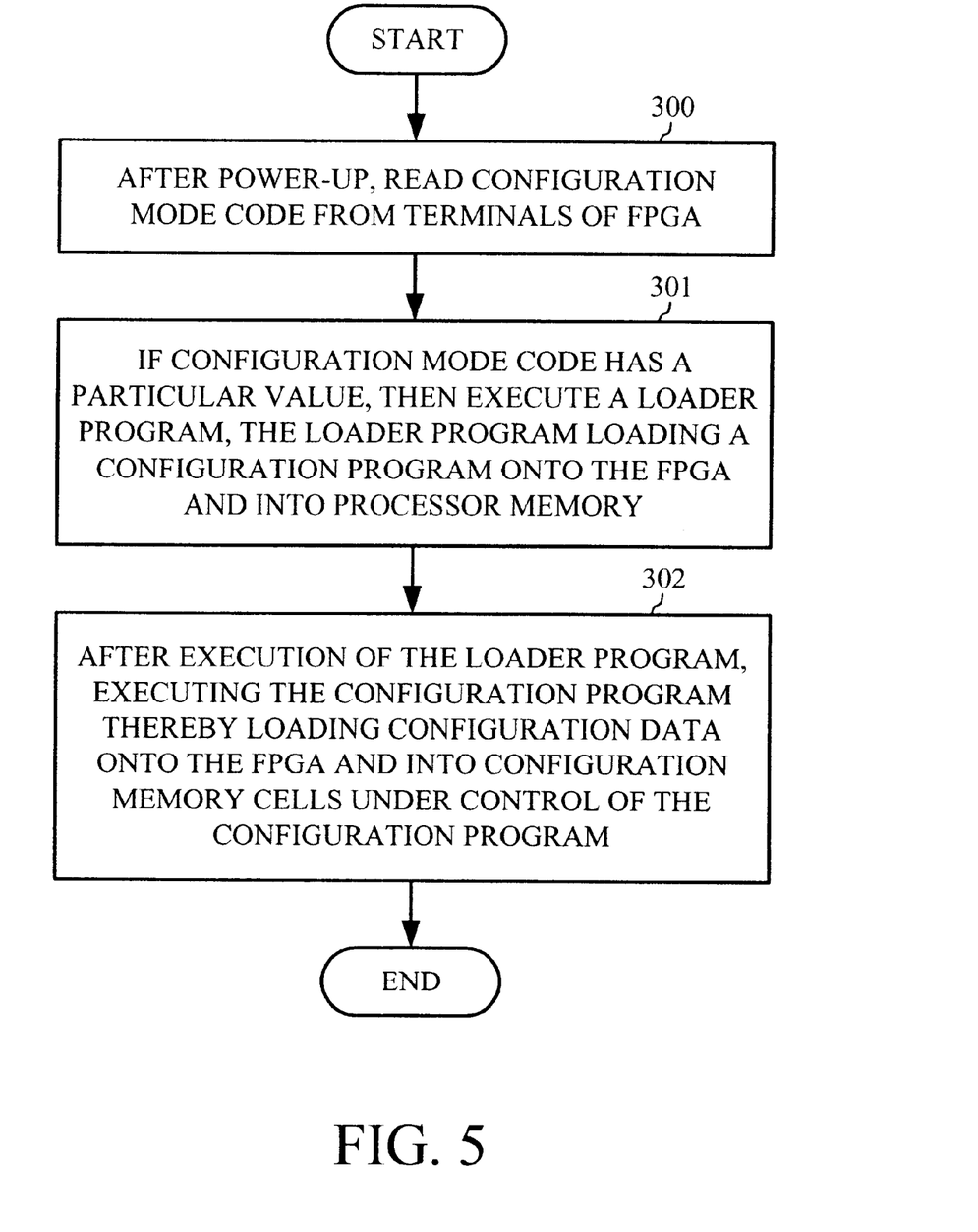
FIG. 5 is a flowchart of a method in accordance with another embodiment of the present invention wherein the processor loads a configuration program onto the FPGA from an external source and then executes the configuration program.

FIG. 5 is a flowchart of a method in accordance with another embodiment. After power-up, processor 9 reads a configuration mode code (step 300) from terminals M0, M1 and M2. If the configuration mode code has a particular value, then processor 9 executes a loader program (step 301) in RAM 12. Execution of this loader program causes processor 9 to configure IOBs such that a configuration program is read onto FPGA 1 and is loaded into RAM 12. The configuration program may be loaded into the FPGA in any number of ways. One way is to read the configuration program from an external PROM, one byte at a time as is done in the "master parallel mode" described above.

After the loader program has loaded the configuration program into RAM 12, processor 9 executes the newly-loaded configuration program (step 302). Execution of this configuration program causes processor 9 to read configuration data onto the FPGA and to load that configuration data into the configuration memory cells of the FPGA, thereby configuring the FPGA for use as the desired user-specific circuit. A user is therefore able to provide a customized configuration mode by loading a customized configuration program into the FPGA and then causing processor 9 to execute that customized configuration program.

Although the present invention is described in connection with certain specific embodiments for instructional purposes, the present invention is not limited thereto. The architecture of the interface logic 14 and 15 that interfaces the processor to the IOBs and the configuration memory cells is but one possible implementation. Other types of interface logic can be provided using standard processor design techniques in order to interface the processor to other IOB, CLB and programmable interconnect structure architectures. In one embodiment, such interface circuitry involves a row pointer such as is set forth by Trimberger in U.S. Pat. No. 5,892,961 entitled "A Field Programmable Gate Array Having Programming Instructions in the Configuration Bitstream". This row pointer points to a row of configuration memory cells. The row pointer is incrementable under control of processor 9. Such a row pointer is implemented, in one embodiment, as a shift register wherein one bit of the shift register contains a digital one to identify one row of the configuration memory cells. The row pointer is incremented by shifting the shift register one bit.

Although the on-chip processor that reads configuration data onto the programmable logic device circuit is described in connection with an SRAM-based FPGA architecture, the onchip processor is usable in other memory-based programmable logic devices including FLASH-based PLDs and FPGAs.

The processor may be dedicated to the configuration process as described above, or alternatively the processor is usable in the user-specific circuit configured into the FPGA. Instructions can be included in the incoming configuration data bit stream. These instructions can be instructions for processor 9, or alternatively can be higher level instructions that are not actual processor instructions themselves but rather indicate higher level functions that are carried out by processor 9 as a series of processor instructions. Accordingly, various modifications, adaptations, and combinations of various features of the described embodiments can be practiced without departing from the scope of the invention as set forth in the claims.

What is claimed is:

1. A method of configuring a programmable logic structure of a programmable integrated circuit, the programmable integrated circuit comprising the programmable logic structure, a plurality of terminals, a processor and a plurality of configuration programs, the method comprising:

(a) reading by the processor one of a plurality of configuration mode codes from the plurality of terminals, the configuration mode code indicating one of the plurality of configuration programs; and (b) executing on the processor said one of the plurality of configuration programs determined by the configuration mode code read by the processor, execution of said one of the plurality of configuration programs causing configuration data to be read onto the programmable integrated circuit and to configure the programmable logic structure.

2. The method of claim 1, wherein the processor executes a first of the configuration programs if the configuration mode code read in (a) has a first value, and wherein the processor executes a second of the configuration programs if the configuration mode code read in (a) has a second value.

3. The method of claim 1, wherein said one of the plurality of configuration programs and the processor together are a means for causing configuration data in a first format to be read onto the programmable integrated circuit, and wherein another of the plurality of configuration programs and the processor together are a means for causing configuration data in a second format to be read onto the programmable integrated circuit.

4. The method of claim 1, wherein said one of the plurality of configuration programs and the processor together are a means for causing configuration data to be read onto the programmable integrated circuit in a serial fashion via a single terminal of the programmable integrated circuit, and wherein another of the plurality of configuration programs and the processor together are a means for causing configuration data to be read onto the programmable integrated circuit in a parallel fashion via a plurality of terminals of the programmable integrated circuit.

5. The method of claim 1, wherein said one of the plurality of configuration programs and the processor together are a means for causing configuration data to be read onto the programmable integrated circuit in a serial fashion via a single terminal of the programmable integrated circuit and converted to a parallel data stream for applying to configuration memory cells.

6. The method of claim 5, wherein said one of the plurality of configuration programs and the processor together cause configuration data to be applied to a serial-in terminal of a shift register and to be read out on parallel output terminals of the shift register.

7. The method of claim 1, wherein the plurality of configuration programs is stored in a metal-mask readonly-memory (ROM) on the programmable integrated circuit.

8. The method of claim 1, wherein during execution of said one of the plurality of configuration programs the processor controls whether a terminal of the programmable integrated circuit is configured as an input terminal or as an output terminal.

9. The method of claim 1, wherein said reading of the configuration mode code by the processor occurs automatically after power-up of the programmable integrated circuit.

10. The method of claim 1, wherein the programmable integrated circuit is a field programmable gate array (FPGA), the configuration data being loaded into memory cells in the FPGA thereby configuring the FPGA.

11. The method of claim 1, wherein the programmable logic comprises a programmable interconnect structure.

12. A method of configuring a programmable integrated circuit, the programmable integrated circuit comprising a programmable logic structure, a processor, and a memory containing a first program and a second program, the method comprising:

receiving a configuration mode code onto the programmable integrated circuit;

if the configuration mode code has a first value then executing on the processor the first program and thereby reading first configuration data in a first format onto the programmable integrated circuit;

if the configuration mode code has the first value then configuring the programmable logic structure using the first configuration data;

if the configuration mode code has a second value then executing on the processor the second program and thereby reading second configuration data in a second format onto the programmable integrated circuit; and if the configuration mode code has the second value then configuring the programmable logic structure using the second configuration data.

13. A programmable integrated circuit, comprising:

a programmable logic structure;

at least one code terminal;

a memory storing a first configuration program and a second configuration program; and a processor, wherein the processor reads the at least one code terminal and determines, based on a configuration mode code on said code terminal, whether to execute the first configuration program or to execute the second configuration program, wherein execution of the first configuration program would cause first configuration data to be read onto the programmable integrated circuit and to configure the programmable logic structure, and wherein execution of the second configuration program would cause second configuration data to be read onto the programmable integrated circuit and to configure the programmable logic structure.

14. The programmable integrated circuit of claim 13, wherein the configuration data read onto the programmable integrated circuit using the first configuration program would be received onto the programmable integrated circuit in serial fashion via a single terminal of the programmable integrated circuit, and wherein the configuration data read onto the programmable integrated circuit using the second configuration program would be received onto the programmable integrated circuit in parallel fashion via a plurality of terminals of the programmable integrated circuit.

15. A programmable integrated circuit, comprising:
   a programmable logic structure;
   a plurality of terminals;
   a memory storing a first configuration program and a second configuration program; and
   means for reading a configuration mode code from the plurality of terminals, and for executing the first configuration program if the configuration mode code has a first value, and for executing the second configuration program if the configuration mode code has a second value, wherein if the first configuration program is executed then configuration data in a first format is received onto the programmable integrated circuit and is used to configure the programmable logic structure, and wherein if the second configuration program is executed then configuration data in a second format is received onto the programmable integrated circuit and is used to configure the programmable logic structure.

16. The programmable integrated circuit of claim 15, wherein the means for reading comprises a processor.

17. The programmable integrated circuit of claim 15, wherein the first format is a serial format, and wherein the second format is a parallel format.

18. The programmable integrated circuit of claim 17, wherein the configuration data in the first format is converted to a parallel format before being input into a processor.

19. The programmable integrated circuit of claim 15, wherein the memory comprises a read-only-memory (ROM).

20. A method of configuring a programmable logic structure of a programmable integrated circuit, the programmable logic structure having configuration memory cells, the programmable integrated circuit comprising the programmable logic structure, a processor, and a plurality of terminals, the method comprising:
   (a) reading by the processor a configuration mode code from the plurality of terminals, the configuration mode code having a first value;
   (b) executing on the processor a loader program if the configuration mode code has the first value, wherein execution of the loader program causes the processor to read a configuration program onto the programmable integrated circuit; and
   (c) executing on the processor the configuration program such that the processor reads configuration data onto the programmable integrated circuit and loads the configuration data into the configuration memory cells of the programmable logic structure.

21. The method of claim 20, wherein the configuration data is read onto the programmable integrated circuit in (b) as a plurality of N-bit words, the N-bit words being received onto the programmable integrated circuit one after another on the same terminals.

22. A programmable integrated circuit, comprising:
   a programmable logic structure comprising a plurality of configuration memory cells;
   a plurality of terminals;
   a memory storing a loader program; and
   a processor that reads a configuration mode code from the plurality of terminals and if the configuration mode code has a first value then the processor executes the loader program, wherein execution of the loader program causes the processor to read a configuration program onto the programmable integrated circuit and execute the configuration program, wherein execution of the configuration program causes configuration data to be read onto the programmable integrated circuit and to be loaded into the configuration memory cells of the programmable logic structure.

23. A programmable integrated circuit, comprising:
   a programmable logic structure comprising a plurality of configuration memory cells;
   a plurality of terminals;
   a memory storing a loader program; and
   means for reading a configuration mode code from the plurality of terminals and if the configuration mode code has a first value then the means executes the loader program, wherein execution of the loader program causes the means to read a configuration program onto the programmable integrated circuit and to execute the configuration program, wherein execution of the configuration program causes configuration data to be read onto the programmable integrated circuit and to be loaded into the plurality of configuration memory cells.

24. The programmable integrated circuit of claim 23, wherein the means for reading comprises a processor.

25. The programmable integrated circuit of claim 24, wherein the means for reading further comprises a frame buffer, wherein the configuration data are loaded into the frame buffer in serial fashion under the control of the processor, and the configuration data are then transferred from the frame buffer to the plurality of configuration memory cells in parallel fashion under control of the processor.

26. The programmable integrated circuit of claim 23, wherein the means for reading further comprises an X register and a Y register, wherein the processor controls the X register and the Y register such that selected ones of the configuration memory cells are accessed and loaded with the configuration data.

27. The programmable integrated circuit of claim 23, wherein the memory comprises both a read-only-memory (ROM) and a random-access-memory (RAM).

28. A programmable integrated circuit comprising:
   a programmable logic structure;
   a programmable interconnect structure;
   a plurality of terminals;
   a processor that automatically reads a configuration mode code from the plurality of terminals after power-up of the programmable integrated circuit; and
   a configuration structure for configuring the programmable logic structure and the programmable interconnect structure, the configuration structure being controlled by the processor.

29. A method of controlling configuration of a programmable integrated circuit having a programmable logic structure, a programmable interconnect structure, and a configuration structure, the method comprising the steps of:
   configuring the configuration structure;
   reading a configuration mode code onto the programmable integrated circuit using the configuration structure;

reading configuration data onto the programmable integrated circuit and using the configuration data to configure the programmable logic structure and the programmable interconnect structure; and reconfiguring the configuration structure.

30. The method of claim 29, wherein the configured programmable logic structure, the configured programmable interconnect structure, and the reconfigured configuration structure together realize a user-specific circuit.

31. The method of claim 30, wherein the configuration structure is controlled by a processor located on the programmable integrated circuit.

32. A programmable integrated circuit, comprising:

a programmable logic structure having a plurality of configuration memory cells;

a plurality of terminals;

a processor that automatically reads a configuration mode code from a source external to the programmable integrated circuit; and a serial-to-parallel converter connected to at least one of said plurality of terminals and to said processor, wherein if the configuration mode code has a predetermined value then said serial-to-parallel converter converts configuration data from serial format to parallel format, the processor reading said configuration data in parallel format from said serial-to-parallel converter and causing said configuration data to configure said programmable logic structure.

* * * * *